(12) United States Patent
Takao (10) Patent No.: US 7,265,432 B2
(45) Date of Patent: Sep. 4, 2007

(54) SOLID STATE IMAGING DEVICE AND METHOD OF FABRICATING THE SAME

(75) Inventor: Hiroaki Takao, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/834,013

(22) Filed: Apr. 29, 2004

(65) Prior Publication Data

US 2004/0222448 A1 Nov. 11, 2004

(30) Foreign Application Priority Data

May 8, 2003 (JP) .......................... P. 2003-130766

(51) Int. Cl.
*H01L 27/146* (2006.01)

(52) U.S. Cl. ...................... 257/448; 257/443; 257/291; 257/72; 257/59; 257/E27.131

(58) Field of Classification Search .................. 257/79, 257/72, 83, 59, 291, 443, 448, E27.131
See application file for complete search history.

(56) References Cited

U.S. PATENT DOCUMENTS

| | | | |
|---|---|---|---|
| 6,252,265 B1 * | 6/2001 | Hatano et al. | 257/250 |
| 6,423,959 B1 * | 7/2002 | Ikeda et al. | 250/208.1 |
| 6,580,105 B1 * | 6/2003 | Hatano et al. | 257/222 |
| 6,606,124 B1 * | 8/2003 | Hatano et al. | 348/311 |
| 6,784,469 B1 * | 8/2004 | Yamane et al. | 257/222 |
| 6,828,679 B2 * | 12/2004 | Azumi | 257/753 |
| 7,091,463 B2 * | 8/2006 | Suzuki et al. | 250/208.1 |
| 7,132,656 B2 * | 11/2006 | Xu et al. | 250/338.4 |
| 2002/0075391 A1 * | 6/2002 | Shizukuishi | 348/319 |

FOREIGN PATENT DOCUMENTS

JP 2001-352049 A 12/2001

* cited by examiner

*Primary Examiner*—Evan Pert
*Assistant Examiner*—Victor A. Mandala, Jr.
(74) *Attorney, Agent, or Firm*—Birch, Stewart, Kolasch & Birch, LLP (57) ABSTRACT

A method for fabricating a solid state imaging device comprising photoelectric conversion sections and charge transfer sections having single-layered charge transfer electrodes for transferring charges generated in the photoelectric conversion sections, the method including formation of the charge transfer electrodes, wherein the formation of the charge transfer electrodes comprises the steps of: forming a conductive film on a surface of a semiconductor substrate having formed thereon a gate oxide film; forming a mask pattern on the conductive film; forming interelectrode spacings in the conductive film using the mask pattern as a mask to make a patterned conductive film; and forming an insulating film to fill in the interelectrode spacings by vacuum chemical vapor deposition.

5 Claims, 8 Drawing Sheets

SOLID STATE IMAGING DEVICE AND METHOD OF FABRICATING THE SAME

FIELD OF THE INVENTION

This invention relates to a solid state imaging device and a method of fabricating the same. In particularly, it relates to an interelectrode insulating film of a solid state imaging device featuring a CCD (charge coupled device) structure having single-layered electrodes.

BACKGROUND OF THE INVENTION

A CCD solid state imaging device useful as an area sensor, etc. has photoelectric conversion sections, such as photodiodes, and charge transfer sections having charge transfer electrodes for transferring signal charges from the photoelectric conversion sections. The charge transfer electrodes are arranged on charge transfer paths formed in a semiconductor substrate and driven by successive voltage application.

In recent years, the pixel count of solid state imaging devices has been increasing to giga pixels or even greater. With an increase of pixels, it is required to transfer signal charges at a higher speed, i.e., to drive charge transfer electrodes by higher speed pulses. To meet the requirement, reduction of interelectrode distance, i.e., formation of an interelectrode insulating film (an insulating film formed between adjacent charge transfer electrodes) with a reduced width at high precision as well as reduction of charge transfer electrode resistance has been highly demanded.

In the manufacture of solid state imaging devices having single-layered charge transfer electrodes, the charge transfer sections and the photoelectric conversion sections have conventionally been formed simultaneously. According to this method, an electrode material layer is formed on a semiconductor substrate via a gate oxide film, and the electrode material layer is patterned to form charge transfer electrodes with gaps therebetween and to make openings as photoelectric conversion sections simultaneously. Thereafter, the inner walls of the gaps and the surface of the photoelectric conversion sections are thermally oxidized to form a silicon oxide film (see JP-A-2001-352049).

Figure 9A:
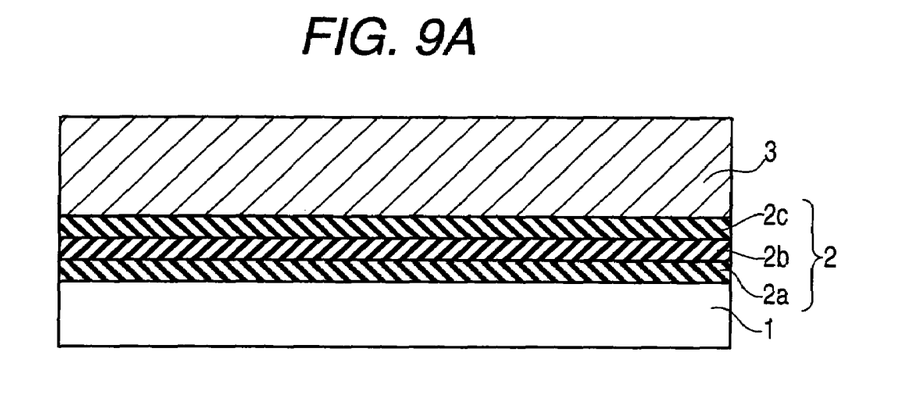

For example, as shown in FIG. 9A, a silicon oxide film 2a having a thickness of 15 nm, a silicon nitride film 2b having a thickness of 50 nm, and a silicon oxide film 2c having a thickness of 10 nm are formed in that order on an n-type silicon substrate 1. These three oxide films constitute a three-layered gate oxide film 2. A polycrystalline silicon film 3 is then formed on the gate oxide film 2.

Figure 9B:
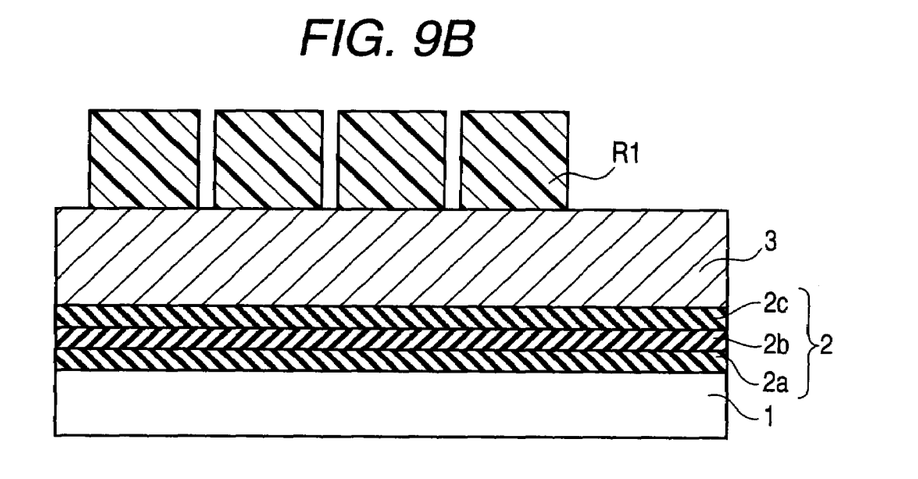

A resist is formed on the polycrystalline silicon film 3. The resist is exposed to light through a mask of prescribed pattern, developed, and rinsed in accordance with a known photolithographic technique to form a resist pattern R1 as shown in FIG. 9B. The resist pattern usually has an opening width of 0.3 to several micrometers.

Figure 9C:
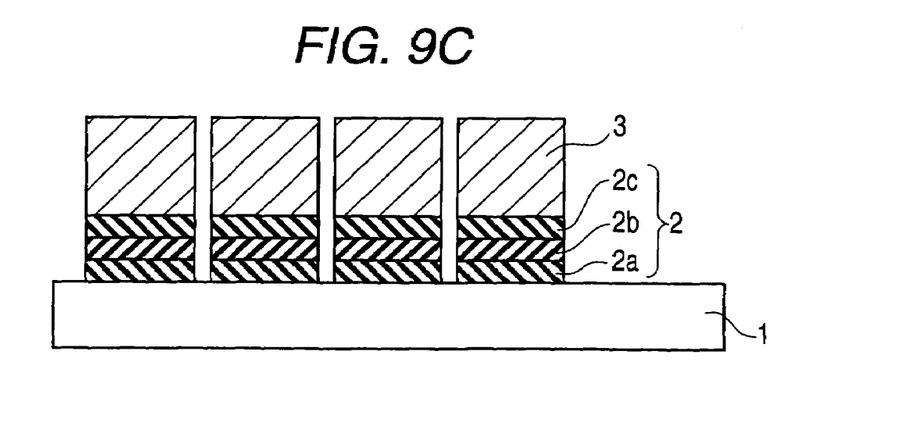

As shown in FIG. 9C, the polycrystalline silicon film 3 is selectively etched out through the resist pattern R1 as a mask using the silicon nitride film 2b as an etching stopper. An array of electrodes (polycrystalline silicon film units) is thus formed.

Figure 10A:
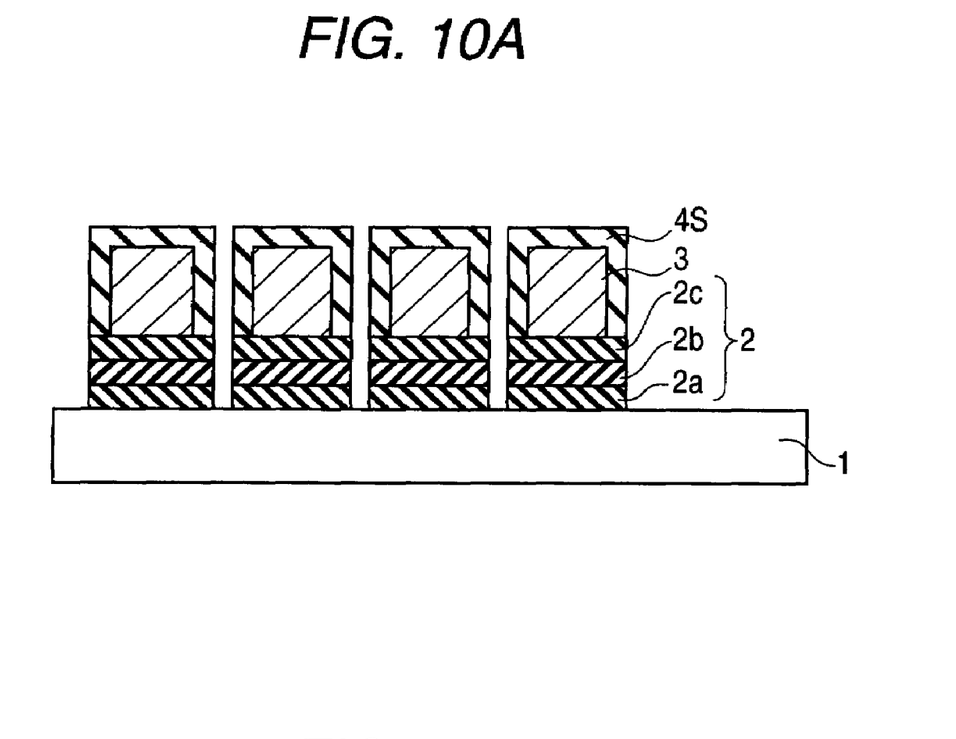

Then, the surface of the electrodes, the substrate exposed between the electrodes, and the substrate corresponding to the photoelectric conversion sections are thermally oxidized to form a silicon oxide film 4S as shown in FIG. 10A. It naturally follows that the gap $g_p$ between the polycrystalline silicon film units 3, i.e., adjacent electrodes is widened by the two thicknesses of the silicon oxide film 4S.

Figure 10B:
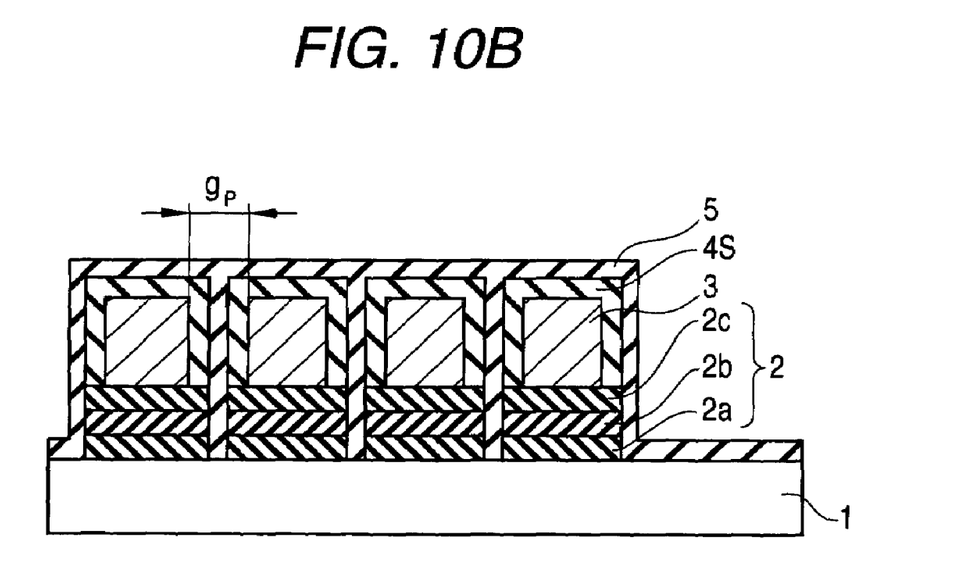

A silicon nitride film 5 is formed on the silicon oxide film 4S as shown in FIG. 10B. Finally, a pn junction is made in the photoelectric conversion sections by ion implantation to form photodiodes. In this way, there is fabricated a solid state imaging device having single-layered charge transfer electrodes made of the polycrystalline silicon film 3.

SUMMARY OF THE INVENTION

In the above-described conventional method, the interelectrode insulating film 4S is formed by thermal oxidation A silicon oxide film formed by thermal oxidation of polycrystalline silicon is poor in film quality compared with that formed by chemical vapor deposition (CVD). A solid state imaging device having such a thermally oxidized insulating film between the electrodes is more liable to suffer from a short circuit as the electrode pattern becomes finer. Besides, since the silicon oxide film 4S is a result of thermal oxidation of the polycrystalline silicon film units, the interelectrode gap is widened by the thicknesses of the silicon oxide film 4S.

When the interelectrode insulating film is formed by thermal oxidation, film thickness control is difficult, resulting in variation of interelectrode gap.

Figure 5A:
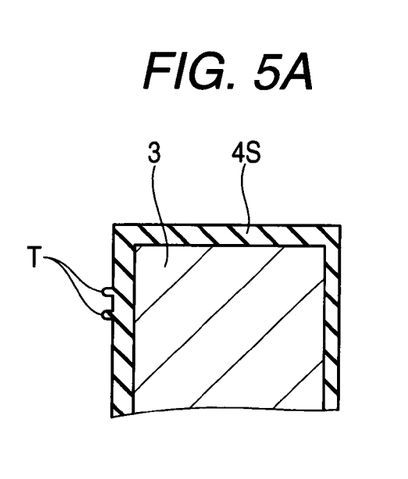
Figure 5B:
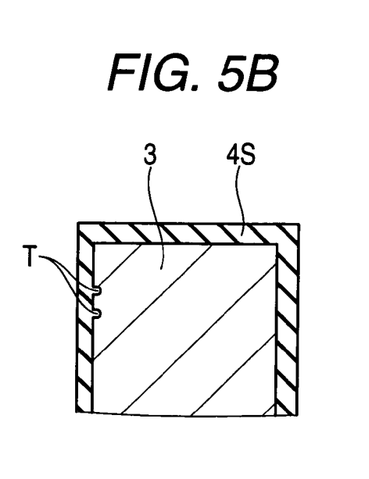

As an electrode material, a silicon-based conductive film such as a doped polycrystalline silicon film is usually used. When such a silicon-based film is thermally oxidized, cases sometimes occur, in which a projection T is formed in the region corresponding to the grain boundaries of the polycrystalline silicon film as shown in FIGS. 5A and 5B. Projections T occur outside in FIG. 5A and inside in FIG. 5B. Projections formed outside as in FIG. 5A tend to stand in the way of the insulating film's filling in the gaps, resulting in void formation. Projections formed inside can change the interelectrode distance as is understood from FIG. 5B.

Hence, the interelectrode insulating film in conventional solid state imaging devices cannot be seen as having sufficient film quality. Since the interelectrode insulating film is formed by surface oxidation of the charge transfer electrode material, the film quality of the resulting interelectrode insulating film is also governed by the physical properties of the electrode material such that projections T may be formed from the grain boundaries as stated above. Where, in particular, a polycrystalline silicone film or an amorphous silicon film is used as a charge transfer electrode material, cases often arise in which the interelectrode distance varies in parts due to, for example, projection formation ascribed to the grain boundaries.

Moreover, where the interelectrode insulating film is formed by surface oxidation of the charge transfer electrodes, the interelectrode distance increases by the thicknesses of the resulting silicon oxide film. That is, even when the original interelectrode distance is minimized to the resolution limit of the resist, formation of the surface silicon oxide film by thermal oxidation results in an increase of the interelectrode distance.

The operational characteristics of a solid state imaging device are heavily dependent on the behavior of a single charge. Therefore, a variation in gap distance between charge transfer electrodes would lead to a variation in charge transfer speed, which will be a great cause of reduction in charge transfer efficiency.

Because of difficulty in further reducing the distance between charge transfer electrodes having a single layer structure, the state-of-the-art interelectrode insulating film has been a great bar to achievement of finer patterning and higher degree of integration.

In the light of the above-mentioned circumstances, it is an object of the present invention to improve charge transfer characteristics of a solid state imaging device having single-layered charge transfer electrodes by increasing the pattern fineness and the number of pixels without impairing dielectric strength.

It is another object of the invention to provide a finely patterned, highly sensitive, and highly reliable solid state imaging device without accompanying reduction in productive yield.

The present invention provides a method of fabricating a solid state imaging device having photoelectric conversion sections and charge transfer sections having single-layered charge transfer electrodes for transferring charges generated from the photoelectric conversion sections. According to the method, the charge transfer electrodes are formed through the steps of forming a conductive film on the surface of a gate oxide film of a semiconductor substrate; forming a mask pattern on the conductive film; forming openings as interelectrode spacings through the conductive film using the mask pattern as a mask; and forming an insulating film to fill in the interelectrode spacings by vacuum CVD.

Forming the interelectrode insulating film by vacuum CVD produces the following effects. The interelectrode insulating film has improved film quality and therefore exhibits increased dielectric strength compared with the one formed by thermal oxidation. The vacuum CVD insulating film shows excellent capability of filling in even very narrow gaps. Unlike thermal oxidation, the vacuum CVD does not involve size reduction of the electrode material film units forming the pattern of electrodes. The freedom of selecting an electrode material is broadened. For instance, it is possible to use a low resistance metal to make the conductive film. The insulating film on the photoelectric conversion sections can be formed simultaneously with the formation of the interelectrode insulating film.

The conductive film is preferably a silicon-based conductive film. As previously described, when thermally oxidized to form an interelectrode insulating film, a silicon-based conductive film, particularly a doped polycrystalline silicon film having grain boundaries, is liable to produce projections, which can cause variation in interelectrode distance. According to the fabrication method of the invention, in contrast, adoption of a vacuum CVD technique makes it possible to form an interelectrode insulating film of silicon oxide or silicon nitride with high density and satisfactory film qualities.

The step of forming a mask pattern preferably includes the substeps of forming a resist film containing an acid component on the conductive film, forming openings through the resist film by photolithography, applying an organic material on the resist film, and heat curing the organic material by the action of the acid component of the resist film to form a cured film on the inner wall of the openings thereby to shrink the openings.

After openings are made through the resist film by photolithography, an organic material is applied to the resist film, followed by heating to cure the organic material to form a cured film on the inner wall of the openings. As a result, the openings shrink to become openings finer than the resolution limit of the resist. The resulting resist film can be used as an etching mask to form charge transfer electrodes having a very small gap therebetween with high dimensional precision. Because the heat cured film is formed of the applied organic material by the action of the acid component of the resist, it is possible to precisely control the thickness of the cured film.

Where ions are implanted onto the substrate surface exposed in the interelectrode gaps for improving charge transfer efficiency, the method of the invention makes it feasible to perform the ion implantation using the resist film, which has been used for electrode patterning, as a mask. Therefore, the thickness and the material of the electrode material film can be chosen without considering whether or not the electrodes can serve as a mask for ion implantation. Accordingly, the electrodes can be formed more easily with freedom of design. The electrode material can be selected with considerations only for improvements on characteristics.

In the substep of forming the openings through the resist film, the width of the openings is preferably 0.2 to 0.5 μm. With the opening width being within that range, the interelectrode insulating film can fill in the interelectrode spacings by vacuum CVD more efficiently.

The method of the invention is particularly beneficial for making a solid state imaging device featuring a small interelectrode distance with high precision and good workability. By making a resist pattern having an original opening width of 0.2 to 0.5 μm and then shrinking the openings by forming a cured film, it is possible to form an electrode pattern having an interelectrode gap of 0.1 μm or smaller with high efficiency and good reproducibility.

The fine openings are formed by reducing the original opening width of the resist film preferably to 0.05 to 0.20 μm. The method of the invention makes it feasible to achieve interelectrode gap (opening width) fineness that exceeds the resolution limit of resist. There is thus provided a highly precise and highly reliable solid state imaging device. Such a small interelectrode gap can never be reached by conventional techniques. The present invention has first made it feasible. Such a small gap can sufficiently be filled with an insulating film by vacuum CVD.

In a preferred embodiment of the invention, such fine openings can be made in the resist film by a substep of heat curing the organic material by the action of the acid component of the resist film to form a resist film on the inner wall of the openings. According to this preferred substep, the gap distance can be controlled with high precision.

It is preferred that the resist film thickness be selected according to the desired opening width so as to provide a highly precise mask pattern, which will lead to production of a highly precise and highly reliable solid state imaging device. From this viewpoint, a desirable resist film thickness is from 1.0 to 1.5 μm.

In the step of etching the conductive film via the resist pattern, it is only the interelectrode spacings that are to be made. That is, the photoelectric conversion sections and the charge transfer sections are separately formed by the respective steps. Therefore, when impurity ions are implanted into the interelectrode gaps using the same resist pattern, implantation of the impurity into the photoelectric conversion sections, which can make it difficult to control impurity concentrations of the photoelectric conversion sections, can be averted.

In a preferred embodiment of the method, the surface of the patterned conductive film is lightly oxidized to form a thin silicon oxide layer after the step of forming interelectrode spacings and before the step of forming an insulating layer. In this case, the interelectrode insulating film has a double layer structure composed of the thin silicon oxide layer and a CVD film. As a result, the insulating film exhibits increased dielectric strength.

In the above-described preferred embodiment where the interelectrode insulating film has the double layer structure, it is particularly preferred for obtaining a higher dielectric strength that the double layer structure is composed of the thin silicon oxide layer (a layer formed by thermal oxidation) and a silicon nitride layer formed by vacuum CVD.

As previously stated, the electrodes can be of a metal film. Metallic electrodes have a lowered resistance and can be driven at a higher speed.

In a preferred embodiment, charge transfer electrodes are composed of a silicon-based conductive film and a metal silicide layer, which are formed by a method including a thermal silicidation step for forming a metal silicide layer in the interface between the silicon-based conductive film and the metal film and a step of selectively removing the metal film remaining non-silicidated. In this embodiment, the resistance of the electrodes is further lowered, and highly reliable electrodes causing no short circuits are provided.

The silicon-based conductive film is preferably etched to a sufficiently lower position than the upper edge of the interelectrode insulating film so that the silicide layer may self-align without causing a short circuit even if a rise of the level of the silicide layer occurs. The rise of the level is the phenomenon that occurs when silicon diffuses in the metal film to form a silicide. More specifically, after the area in contact with silicon is silicidated, silicon diffuses in the metal around the silicide, and silicidation further proceeds. As a result, silicide shows so-called lateral growth and extends along the side wall of the insulating film.

After the silicidation, the non-silicidated metal film is removed by etching. In this embodiment, the photolithographic step or the etching step necessary to form a low resistance layer, such as a metal layer, is not needed. Thus, the number of steps involved is reduced, and the yield is improved thereby.

The step of forming a silicon-based conductive film preferably comprises the substeps of forming a polycrystalline silicon film and doping the resulting polycrystalline silicon film with an impurity. A conductive film having a desired impurity concentration can thus be formed under good control.

The step of forming a silicon-based conductive film preferably comprises the substep of forming an amorphous silicon film while incorporating a dopant impurity. In this case, the step of doping with an impurity is unnecessary, and a highly reliable film can easily be formed.

The silicon-based conductive film may be replaced with a metal or metal silicide film or a laminate film composed of a silicon-based conductive film and a metal or metal silicide film. Titanium silicide is a preferred metal silicide that will bring about further reduction in resistance. Cobalt silicide is a still preferred metal silicide that undergoes no agglomeration in the subsequent heat treatment and will provide a silicide film with a further reduced resistance. Other useful metal silicides include nickel silicide, palladium silicide, platinum silicide, and tantalum silicide.

In order to prevent an increase of resistance of the metal silicide layer due to agglomeration, titanium, cobalt, nickel, palladium, platinum or tantalum or a nitride, alloy, compound or composite of these metal elements may be provided on the metal silicide layer.

Before the metal film is formed, the area where a metal silicide layer is not needed, such as the peripheral circuitry area, is preferably protected with a resist.

After the non-silicidated metal film is removed, the metal silicide film may be annealed by heat treatment thereby to reduce its resistance.

The thermal silicidation is preferably carried out at 690° to 800° C. in a nitrogen atmosphere. After removal of the non-silicidated metal film, the heat treatment for annealing is preferably carried out at 800° C. or higher. That is, silicidation at a relatively low temperature of 690° to 800° C. followed by annealing at 800° C. or higher results in the formation of low-resistance charge transfer electrodes free from short circuits. If the silicidation temperature is lower than 690° C., the silicidation reaction does not proceed sufficiently, resulting in a failure to achieve resistance reduction. Where the temperature exceeds 800° C., the silicidation reaction proceeds excessively. This can result in a reduction of the silicon-based conductive film thickness and a failure to obtain a necessary resistance.

The solid state imaging device according to the present invention comprises photoelectric conversion sections and charge transfer sections having single-layered charge transfer electrodes for transferring charges generated in the photoelectric conversion sections. The charge transfer electrodes are a pattern of conductive film units arrayed on the surface of a semiconductor substrate having formed thereon a gate oxide film. An interelectrode insulating film formed by vacuum CVD is interposed between the conductive film units.

The conductive film is preferably a silicon-based conductive film. The width of the interelectrode insulating film at the interface with the gate oxide film is preferably 0.05 to 0.20 µm. The charge transfer electrodes preferably have a thermally oxidized film between the interelectrode insulating film and conductive film units.

The interelectrode insulating film preferably contains a silicon nitride film.

BRIEF DESCRIPTION OF THE DRAWINGS

FIGS. 1 and 2 (FIGS. 1A, 1B and 1C, and FIGS. 2A and 2B) represent a flow chart illustrating the steps of fabricating a solid state imaging device according to a first embodiment of the invention.

FIG. 5 (FIGS. 5A and 5B) shows charge transfer electrodes formed by a conventional method.

FIG. 6 (FIGS. 6A and 6B) shows charge transfer electrodes formed by the method of the invention.

FIGS. 7 and 8 (FIGS. 7A, 7B, 7C and 7D, and FIGS. 8A and 8B) represent a flow chart showing the steps of fabricating a solid state imaging device according to a second embodiment of the invention.

FIGS. 9 and 10 (FIGS. 9A, 9B and 9C, and FIGS. 10A and 10B) are a flow chart illustrating the steps of fabricating a solid state imaging device according to a conventional method.

DETAILED DESCRIPTION OF THE INVENTION

The preferred embodiments of the present invention will be described with reference to the accompanying drawings.

Figure 1A:
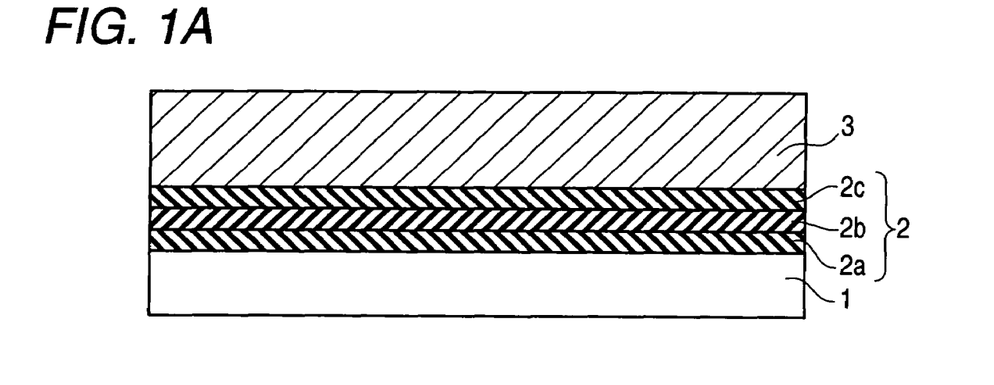
Figure 1B:
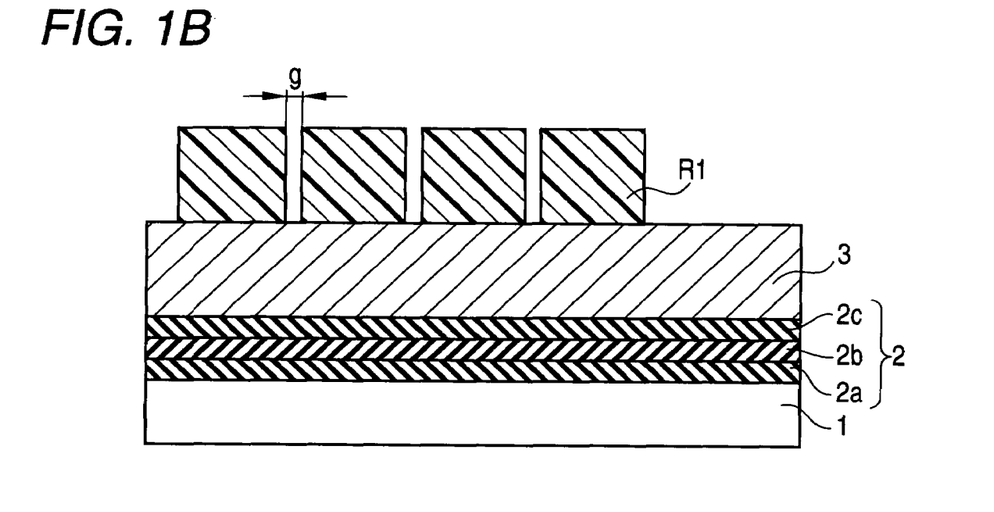
Figure 1C:
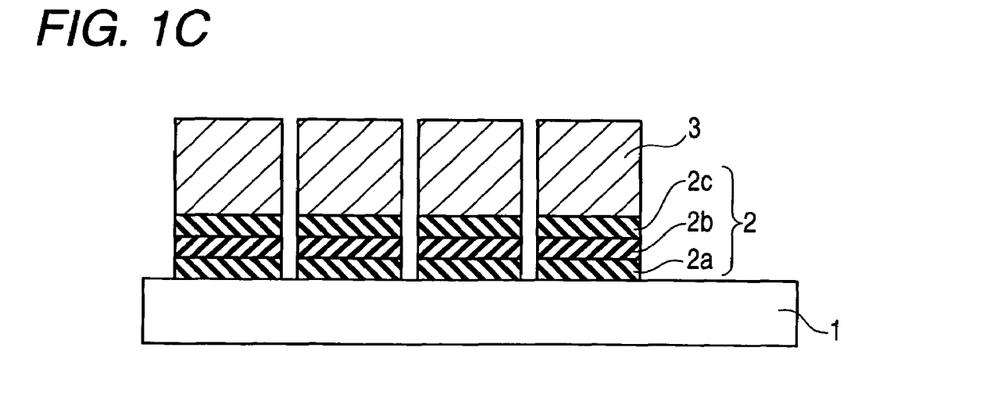
Figure 2A:
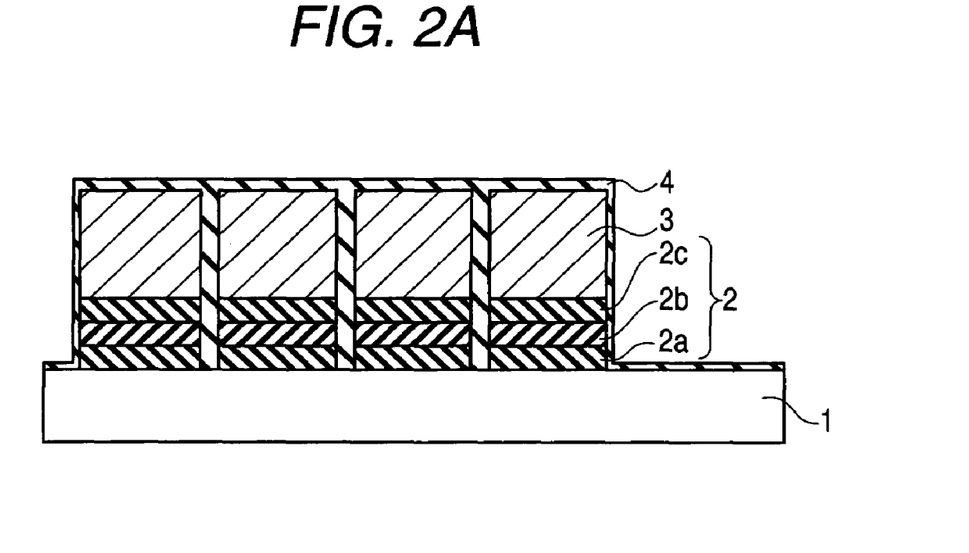
Figure 2B:
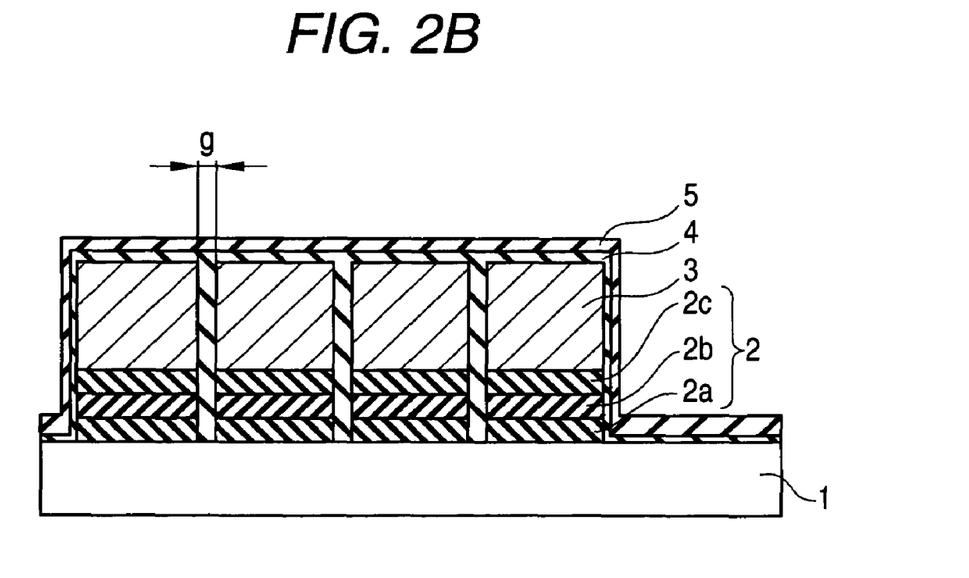
Figure 3:
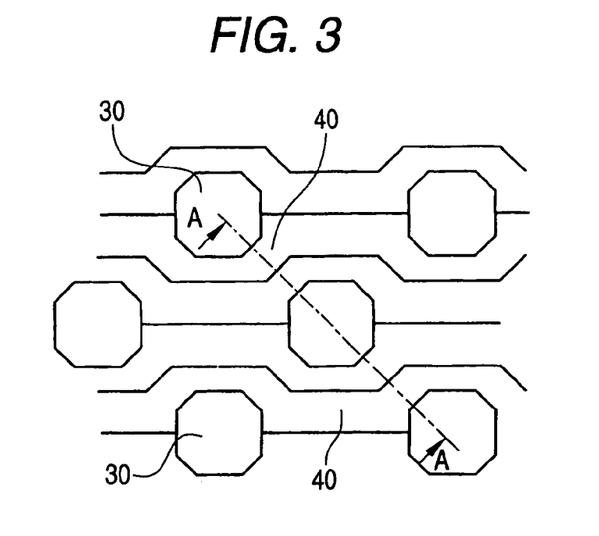
FIG. 3 is a plan of a solid state imaging device according to the present invention.

FIGS. 1 through 3 represent a method of fabricating a solid state imaging device according to a first embodiment of the invention.

Figure 4:
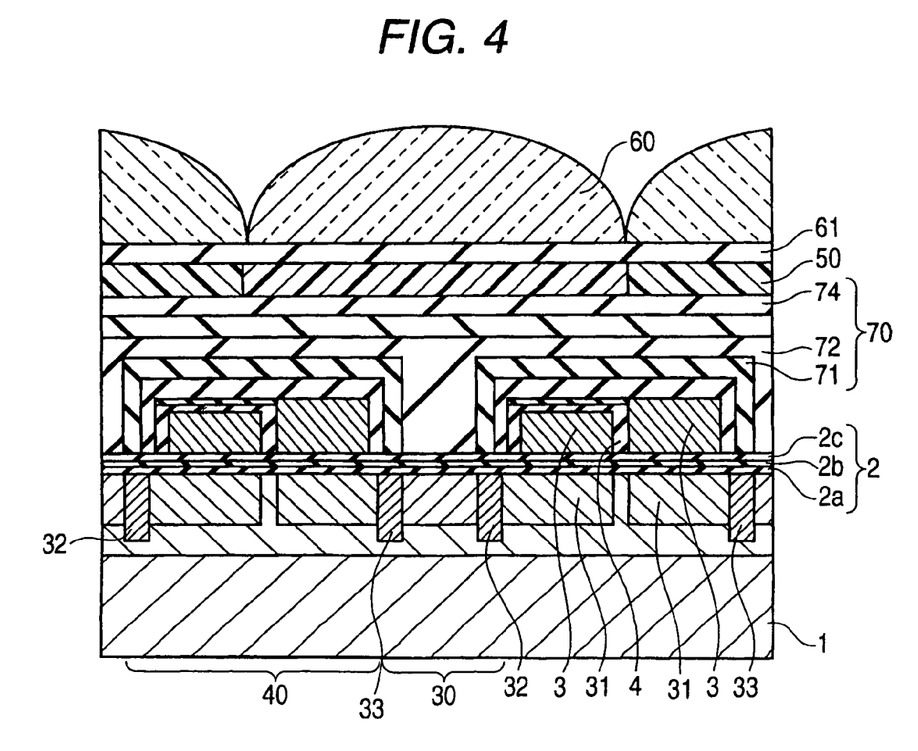
FIG. 4 is a schematic cross-section of a solid state imaging device according to the invention.

The method is characterized by the process of forming the electrodes separated with a small interelectrode spacing and filling the interelectrode spacings with an interelectrode insulating film of silicon oxide by vacuum CVD as shown in FIGS. 1 and 2. FIGS. 3 and 4 show a schematic plan view and a schematic cross-sectional view, respectively, of the solid state imaging device produced by the method.

In the first embodiment, the gap g, the interelectrode distance, is set at 0.2 μm. In such narrow interelectrode gaps is formed an interelectrode insulating film 4 of silicon oxide by vacuum CVD. The silicon oxide insulating film 4 formed by vacuum CVD exhibits satisfactory film qualities.

The openings with such a small gap g can be formed as follows. A resist film is patterned by photolithography. An organic material is applied to the patterned resist film and heat cured to form a cured film on the surface of the patterned resist film. As a result, the size of the openings of the resist film is reduced to provide openings finer than the resolution limit of the resist. The resulting resist film can be used as an etching mask to form charge transfer electrodes having a very small gap therebetween with high dimensional precision.

The heat cured film is a self-alignment product formed of the organic material by the action of the acid component of the resist.

If desired, ion implantation into the substrate surface in the charge transfer sections can be performed making use of this resist film as a mask.

The semiconductor substrate 1 is an n-type silicon substrate having an impurity concentration of about $1.0 \times 10^{16}$ $cm^{-1}$. The gate oxide film on the silicon substrate has a three-layer structure composed of a silicon oxide film 2a, a silicon nitride film 2b, and a silicon oxide film 2c.

As schematically illustrated in FIGS. 3 and 4, the silicon substrate 1 has formed thereon a plurality of photodiodes 30. Charge transfer sections 40 for transferring the signal charges detected by the photodiodes are formed in a serpentine configuration winding among the photodiodes.

While not shown in FIG. 3, charge transfer channels 31 through which the signal charges are transferred by the charge transfer electrodes are also formed in a serpentine configuration winding in a direction across the winding direction of the charge transfer sections 40.

The interelectrode insulating films which are provided in the vicinities of the borders between the photodiode sections 30 and the charge transfer sections 40 are not depicted in FIG. 3.

As shown in FIG. 4, the silicon substrate 1 has formed therein the photodiodes 30, charge transfer channels 31, channel stop regions 32, and charge reading regions 33 and has formed thereon a gate oxide film 2. On the gate oxide film 2, charge transfer electrodes 3 are formed. The charge transfer electrodes 3 are separated from each other via a very thin interelectrode insulating film 4 formed by vacuum CVD.

An interlayer insulating film 70 is provided on the upper side of the charge transfer electrodes in the charge transfer sections 40. Numerals 71, 72, and 74 indicate a light shielding film, an insulating film (P-TEOS), and a planarizing layer made of borophospho silicate glass (BPSG).

A light shielding film is provided in the upper part of the solid state imaging device except for the areas corresponding to the photodiode sections 30. A color filter 50 and a microlens array 60 are also provided in the upper part of the solid state imaging device. A planarizing layer 61 made of an insulating, transparent resin, etc. is provided between the color filter 50 and the microlens array 60. Since all these members are conventional, the description of them is omitted. While the solid state imaging device shown in FIG. 3 has a honeycomb design, the present invention is also applicable to a solid state imaging device having pixels in the standard checkerboard design.

The steps for producing the solid state imaging device according to the first embodiment will be described in greater detail.

A 15 nm thick silicon oxide film 2a, a 50 nm thick silicon nitride film 2b, and 10 nm thick silicon oxide film 2c are formed on an n-type silicon substrate 1 in that order to make a three-layered gate oxide film 2.

As shown in FIG. 1A, a 0.4 μm thick polycrystalline silicon film 3 is deposited on the gate oxide film 2 by vacuum CVD using He-diluted $SiH_4$ as a reactive gas. The substrate temperature during the vacuum CVD is set between 600° and 700° C. The polycrystalline silicon film 3 is then doped with phosphorus by heat treating at 900° C. in a $POCl_3/N_2/O_2$ mixed gas atmosphere.

A positive resist is applied to the polycrystalline silicon film 3 to a thickness of 0.5 to 1.4 μm.

A mask having a desired pattern is superposed on the resist. The resist is exposed to light, developed, and washed with water (i.e., photolithography) to provide a resist pattern R1 having an opening gap g of 0.2 μm as shown in FIG. 1B.

The polycrystalline silicon film 3 is selectively removed to leave an electrode pattern as shown in FIG. 1C by reactive ion etching (RIE) with an $HBr/O_2$ mixed gas or an $HBr/Cl_2$ mixed gas using the resist pattern R1 as a mask and the silicon nitride film 2b as an etching stopper. RIE is preferably performed with an ECR (electron cyclotron resonance) ion source or an ICP (inductively coupled plasma) reactor. After the etching, the resist pattern R1 is removed by, for example, ashing.

Silicon oxide is deposited on the electrode pattern by vacuum CVD using monosilane and $N_2O$ to form a 80 nm thick interelectrode insulating film 4 (high-temperature oxide (HTO) film) as shown in FIG. 2A. In the vacuum CVD, the substrate temperature is maintained at 750° C., and the pressure of the vacuum chamber is 1.2 Torr.

Silicon nitride is then deposited on the interelectrode insulating film 4 by vacuum CVD using $NH_3$ and dichlorosilane ($SiH_2Cl_2$) to form an insulating film 5 of silicon nitride.

A resist is applied to the insulating film 5 and patterned by photolithography to make a resist pattern of openings corresponding to photodiode regions, i.e., the photoelectric conversion sections. Photodiode regions are made through the polycrystalline silicon film 3 by etching with an $HBr/O_2$ mixed gas or an $HBr/Cl_2$ mixed gas using the resist pattern as a mask.

Ion implantation is then carried out using the same resist pattern as a mask to form diffusion regions providing a pn junction in the substrate 1 as photoelectric conversion sections.

There is thus fabricated a solid state imaging device having single layered electrodes. The width of the interelectrode insulating film 4 is substantially the same as the gap g of the resist pattern R1. The distance between the patterned conductive film units as a result of etching is retained in the final electrode array with high dimensional precision. The interelectrode gapping is controllable satisfactorily as compared with the method relying on surface oxidation of polycrystalline silicon film electrodes. The interelectrode gap can be maintained at the possible minimum.

Being an HTO film formed by vacuum CVD, the interelectrode insulating film of silicon oxide has satisfactory film qualities and high dielectric strength.

A 100 nm thick P-TEOS film 72 is formed thereon. A 700 nm thick BPSG film 73 is formed on the P-TEOS film 72 and made to reflow at 850° C. for planarization to complete an interlayer insulating film 70. On the interlayer insulating film 70 are further provided a color filter 50, a planarizing layer 61, and a microlens array 60 to complete the solid stage imaging device shown in FIGS. 3 and 4.

While in the above-described first embodiment the electrodes are made of a doped polycrystalline silicon film, a metal film such as a titanium film may be provided on the electrodes by, for example, sputtering to reduce the electrode resistance. Sputtering with titanium is preferably preceded by sputter etching with an argon plasma in a sputtering system to remove the spontaneously formed oxide on the polycrystalline silicon film surface. Subsequently, the polycrystalline silicon film is subjected to the sputtering without being exposed to the air, whereby the resistance is reduced in a stable manner.

It is also possible to make the charge transfer electrodes of a metal film. In this case, the electrode film thickness can be reduced, which brings about improved transfer efficiency and provides a flatter surface.

Figure 6A:
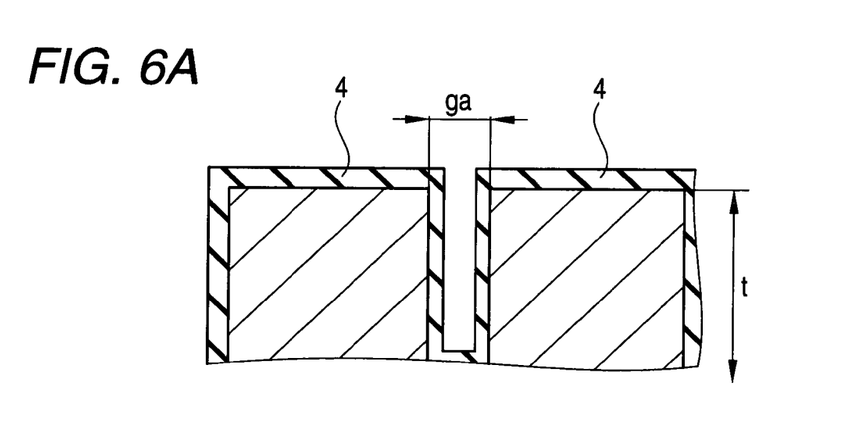
Figure 6B:
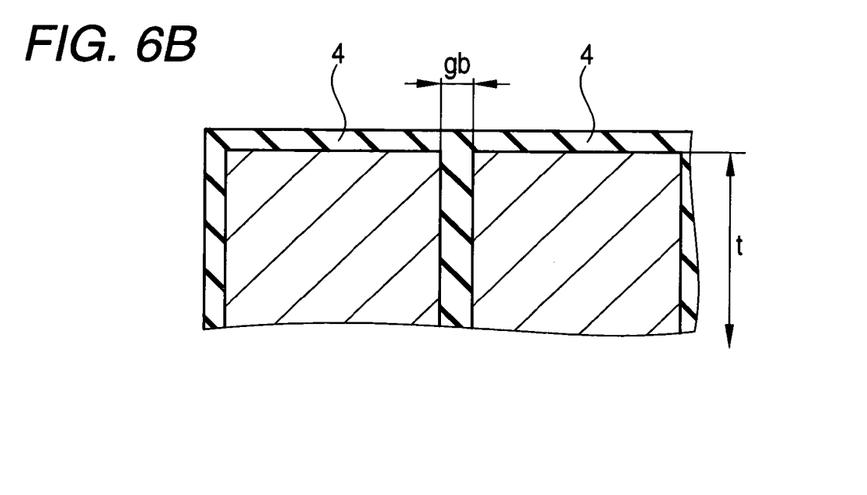

It is desirable that the interelectrode spacing width (gap g) in which the interelectrode insulating film is formed be decided so that the interelectrode spacings maybe completely filled with the insulating film by vacuum CVD as depicted in FIG. 6B. If the gap distance is too long as in FIG. 6A, the interelectrode insulating film 4 would suffer from void formation.

The interelectrode insulating film 4 is formed only by vacuum CVD in the first embodiment. In the second embodiment of the invention, formation of the interelectrode insulating film is carried out by first forming a thin silicon oxide film 4S by thermal oxidation and then forming a silicon nitride film 4N by vacuum CVD. The method according to the second embodiment will be described with reference to FIGS. 7 and 8.

Figure 7A:
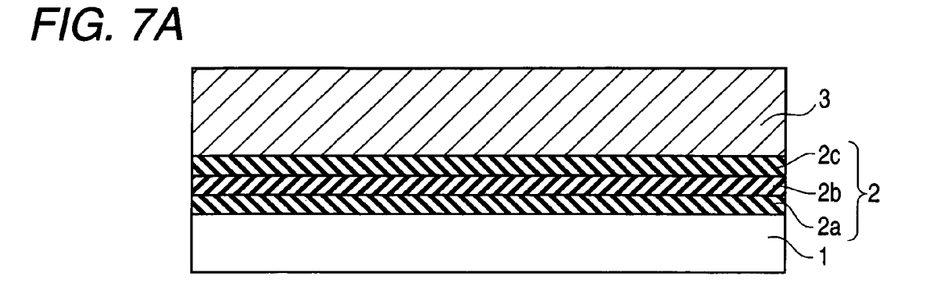
Figure 7B:
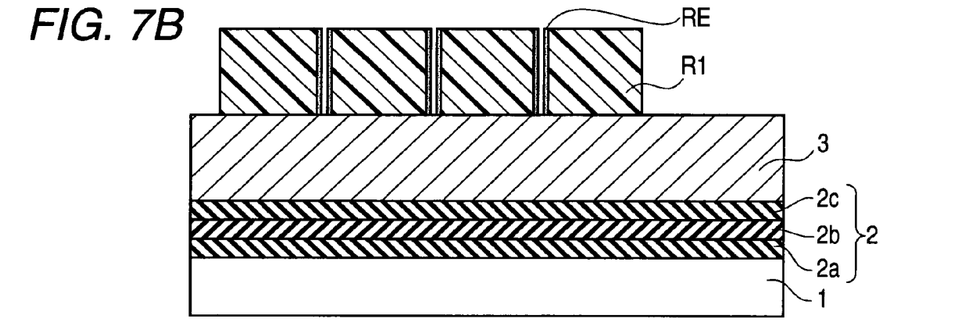

Formation of a resist pattern R1, which is shown in FIGS. 7A and 7B, can be performed in the same manner as in the first embodiment. Thereafter, the openings of the resist pattern R1 are shrunken (i.e., the size of the openings is reduced) by what we call a RELACS (resolution enhancement lithography assisted by chemical shrink) technique as follows. An organic material (AZ-R200) is applied onto the resist pattern R1 and heat treated at 75 to 120° C. to form a cured film RE as shown in FIG. 7B. As a result, the size of the openings (gap g) is reduced to 0.08 μm.

Figure 7C:
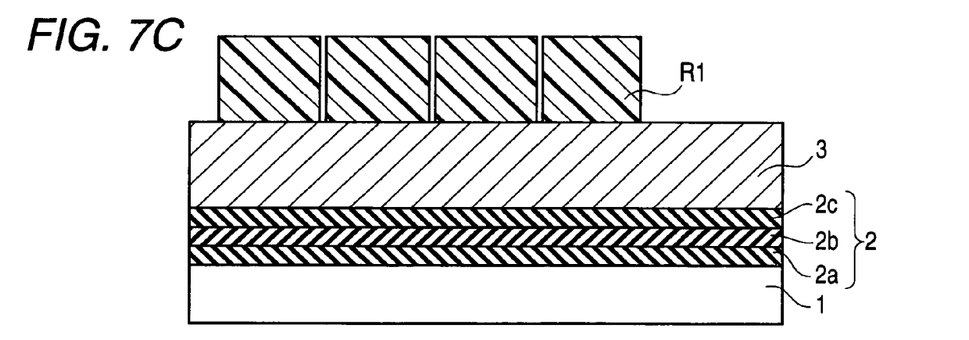
Figure 7D:
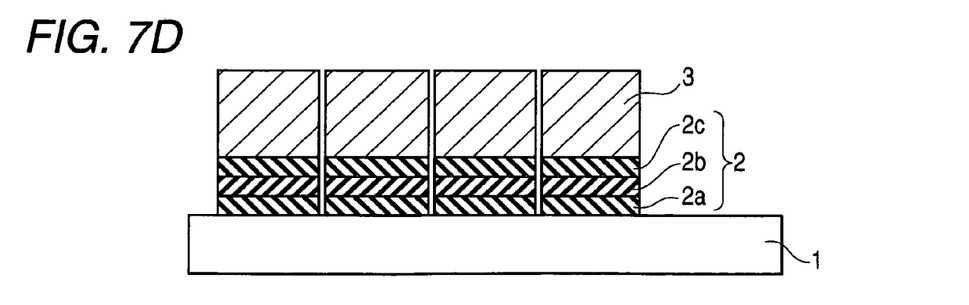

The polycrystalline silicon film 3 is selectively etched to make an electrode pattern by RIE. The RIE is carried out with an HBr/$O_2$ mixed gas or an HBr/$Cl_2$ mixed gas using the resist pattern R1 having the cured film RE as a mask and the silicon nitride film 2b as an etching stopper. RIE is preferably performed with an ECR ion source or an ICP reactor. After the etching, the resist pattern R1 and the cured film RE are removed by, for example, ashing.

Figure 8A:
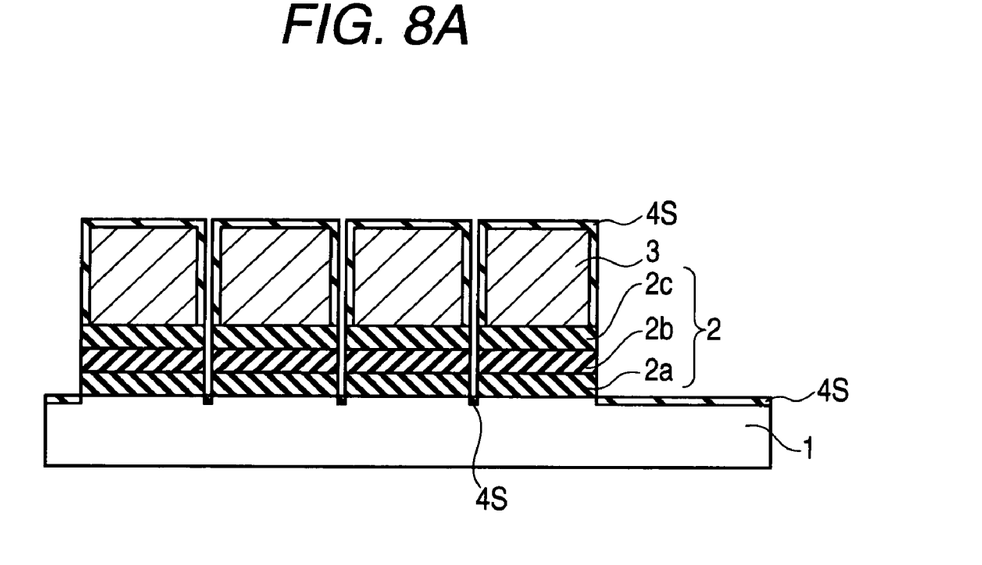

The patterned polycrystalline silicon film 3 is oxidized by heating at 900° C. for 30 to 60 minutes in an HCl/$O_2$ atmosphere to form a silicon oxide film 4S as shown in FIG. 8A. As a result, the interelectrode distance increases by the two thicknesses of the silicon oxide film 4S. This does not ruin the fineness of the electrode pattern because the gap distance before the oxide film formation has been sufficiently reduced by the RELACS technique. In this particular embodiment, the final gap distance g (see FIG. 8B) is 0.2 μm.

Figure 8B:
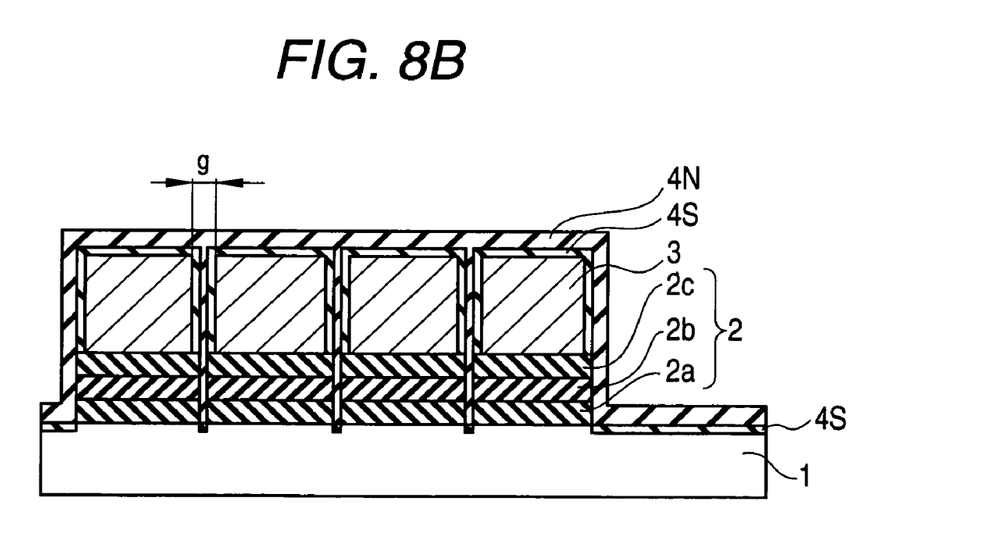

The silicon oxide film 4S is then covered with an insulating film 4N of silicon nitride by vacuum CVD using ammonia and dichlorosilane as shown in FIG. 8B.

Thereafter, the same processing steps as in the first embodiment are followed to produce a solid state imaging device of the present invention.

The resist pattern R1 having the cured film RE on the inner wall surrounding the openings can be used to form single-layered electrodes separated via a gap narrower than the resolution limit of the resist. Furthermore, by using the resist pattern having such a narrow gap as a mask of ion implantation, ion implantation into the gaps can be achieved with high positional precision (with no positional displacement).

While the electrode material used in the first and the second embodiments is doped polycrystalline silicon, the charge transfer electrodes can be made of a metal or may have a double layer structure composed of doped polycrystalline silicon and a metal silicide.

The metal silicide that may be used to make up the electrodes includes titanium silicide, tantalum silicide, tungsten silicide, molybdenum silicide, nickel silicide, cobalt silicide, and platinum silicide. It is also possible to form a layer of a nitride, alloy, compound or composite containing titanium, tantalum, tungsten, molybdenum, nickel, cobalt or platinum on the metal silicide layer.

Suitable metals which can make up the electrodes include titanium, tantalum, tungsten, molybdenum, nickel, cobalt, and platinum.

The silicon-based conductive film used to make charge transfer electrodes is not limited to the polycrystalline silicon film as adopted in the foregoing embodiments. For example, other silicon-based conductive materials, such as amorphous silicon and microcrystalline silicone, are also usable.

The present invention provides the following effects. The method of the invention does not involve an increase of the interelectrode distance. Since the interelectrode insulating film is formed by vacuum CVD, the interelectrode gap as formed by etching can be maintained with high precision. Therefore, a high dielectric strength, highly reliable solid state imaging device can be manufactured.

Where formation of the interelectrode insulating film by vacuum CVD is preceded by light oxidation of the electrode surface to form a laminate insulating film, the high dielectric strength can be retained.

Where the RELACS technique is applied to the preparation of resist mask pattern, charge transfer electrodes separated via a gap smaller than the resolution limit are formed with high dimensional precision. In this case, even when the electrode surface is lightly oxidized, which necessarily results in an increase of the interelectrode distance, the dielectric strength can be improved while maintaining a fine interelectrode gap.

The present invention has makes it feasible to form highly precise and highly reliable charge transfer electrodes at a small pitch and with good workability.

This application is based on Japanese Patent application JP 2003-130766, filed May 8, 2003, the entire content of which is hereby incorporated by reference, the same as if set forth at length.

What is claimed is:

1. A solid state imaging device comprising photoelectric conversion sections and charge transfer sections having single-layered charge transfer electrodes for transferring charges generated in the photoelectric conversion sections, wherein:

the charge transfer eletrodes are a pattern of conductive film units arrayed on a surface of a seminconductor substrate having formed thereon a gate oxide film, the conductive film units being separated by a gap of 0.08 μm to 0.2 μm, said gap being a shrunk gap formed by resolution enhancement lithography assisted by chemical shrink, the conductive film units being separated from one another via an interelectrode insulating film formed by vacuum chemical vapor deposition, and wherein the shrunk gap is reduced to a size of 0.08 μm.

2. The solid state imaging device according to claim 1, wherein the conductive film is a silicon-based conductive film.

3. The solid state imaging device according to claim 1, wherein a width of the interelectrode insulating film at an interface with the gate oxide film is 0.05 to 0.20 μm.

4. The solid state imaging device according to claim 2, wherein the charge transfer electrodes further have a thermally oxidized film between the interelectrode insulating film and conductive film units.

5. The solid state imaging device according to claim 4, wherein the interelectrode insulating film contains a silicon nitride film.

* * * * *